United States Patent [19]

Wilkens et al.

[11] 4,426,623
[45] Jan. 17, 1984

[54] RIPPLE FREE AMPLITUDE DEMODULATOR

[75] Inventors: Dean R. Wilkens; Dan B. Harned; Norman W. Hawn, all of Phoenix, Ariz.

[73] Assignee: Sperry Corporation, New York, N.Y.

[21] Appl. No.: 279,899

[22] Filed: Jul. 2, 1981

[51] Int. Cl.³ .................. H03K 9/06; H03K 9/00; H03K 9/02

[52] U.S. Cl. ........................... 329/178; 329/104; 329/109; 329/101

[58] Field of Search .............. 329/101, 178, 192, 102, 329/109, 104, 166; 455/202, 203, 204, 337; 328/26, 32; 307/353, 151; 363/127

[56] References Cited

U.S. PATENT DOCUMENTS 3,482,174 12/1969 James .................... 329/178

Primary Examiner—Stanley D. Miller
Assistant Examiner—S. Clark
Attorney, Agent, or Firm—Howard P. Terry

[57] ABSTRACT

A pulse sample demodulator which has a first sample and hold circuit detects the peak amplitude of the time varying waveform during a short sampling interval. The first sample and hold circuit is triggered by narrow pulses produced by a circuit responsive to the occurrence of each peak in the time varying waveform. A second sample and hold circuit, sampling during an interval not coincident with the first sampling interval, receives the information stored in the first sample and hold circuit; but sampling at a different interval, it does not receive the time varying signal applied to the first sample and hold circuit, which would otherwise appear as ripple in the output of the demodulator.

10 Claims, 5 Drawing Figures

RIPPLE FREE AMPLITUDE DEMODULATOR

BACKGROUND OF THE INVENTION

1. Field of the Invention

This invention relates generally to amplitude demodulators and in particular to a substantially ripple free pulse sample amplitude demodulator for use with sensitive equipment such as high gain amplifiers or rate detectors, which by their normal operation tend to aggravate any noise or ripple on the demodulated signal. Although the applications for this invention are many, it is particularly suited for use in high performance servosystems such as autopilot control surface servosystems.

2. Description of the Prior Art

The simplest amplitude modulation detector or demodulator is a diode rectifier. The ideal diode detector passes current in only one direction and will essentially follow the envelope of an amplitude modulated waveform. Although the simple circuit is quite effective in many applications, it requires heavy filtering to control ripple and is not useful in sensitive servosystems which require virtually ripple free demodulation, but are intolerant of heavy filtering. Heavy filtering using large capacitors, for example, is not advised in servo applications because large capacitors cause large time delays in circuit response which deteriorate system performance. To further complicate matters, many servosystems must respond to the velocity as well as the position of the system being controlled. In an autopilot system, such as the one shown in U.S. Pat. No. 3,848,833, issued to Applicants' assignee, for instance, the movement of the control surface, rudder, elevator, aileron, is closely servo controlled with respect to position and rate of change in position. The position information is taken from a detector such as a linear voltage displacement transducer or LVDT, which produces an a.c. signal and must be demodulated before use. The velocity information may be produced by a tachometer or it can be derived by differentiating the demodulated position signal. It is characteristic of differentiating or rate taking circuits that when a signal is processed therein, what was tolerable ripple at the input becomes greatly distorted and amplified at the output. For instance, a substantially d.c. signal having generally triangle shaped noise impulses thereon, becomes a d.c. signal with high amplitude rectangle noise spikes when differentiated. Thus, it is critical that ripple be eliminated from the demodulated position signal before it is differentiated and naturally, due to the attendant phase error, large filter capacitors must be avoided.

Most autopilot servosystems employ a pulse sample demodulator which, in the ideal case, takes a sample of the position signal waveform at precisely timed intervals coinciding with the waveform peak voltage. The sampled voltage is held in a holding circuit between peaks thus producing a true reading of the waveforms peak amplitude voltage. But no demodulator is ideal and because sampling times cannot be infintely short, the demodulated signal still contains a trace of the modulated position signal, for reasons that will be explained below. Thus, even with pulse sample demodulators of the conventional type, filter capacitors are required to sufficiently eliminate unwanted ripple. The present invention virtually eliminates this unwanted ripple at a low cost, using a nominal number of components, and without the necessity of filter networks which often require more components and printed circuit board space than does the invention.

SUMMARY OF THE INVENTION

The present invention provides an amplitude demodulator for detecting the amplitude of time varying signals that are so ripple free that heavy filtration is not required, thus making the demodulator ideal for use in rate sensing servosystems, differentiating circuits, and other high gain circuits. The demodulator includes a first signal sampling and holding circuit to which a time varying signal is applied and a second signal sampling and holding circuit in series relation with the first circuit. A short duty cycle pulse train is generated and applied to both signal sampling and holding circuits causing the first circuit to sample, during the short on duty cycle, and hold, for the remainder of the cycle, the peak voltage of the time varying waveform. The second signal sampling circuit operates in a converse fashion to sample, during the off duty cycle, and hold, for the duration, the voltage stored in the first circuit. Thus, the second sampling circuit operates to block from the output all ripple entering the first sampling circuit during the on duty cycle. For a further and more detailed understanding of this invention, reference is made to the following description and accompanying drawings.

DESCRIPTION OF THE PREFERRED EMBODIMENT

Figure 1:
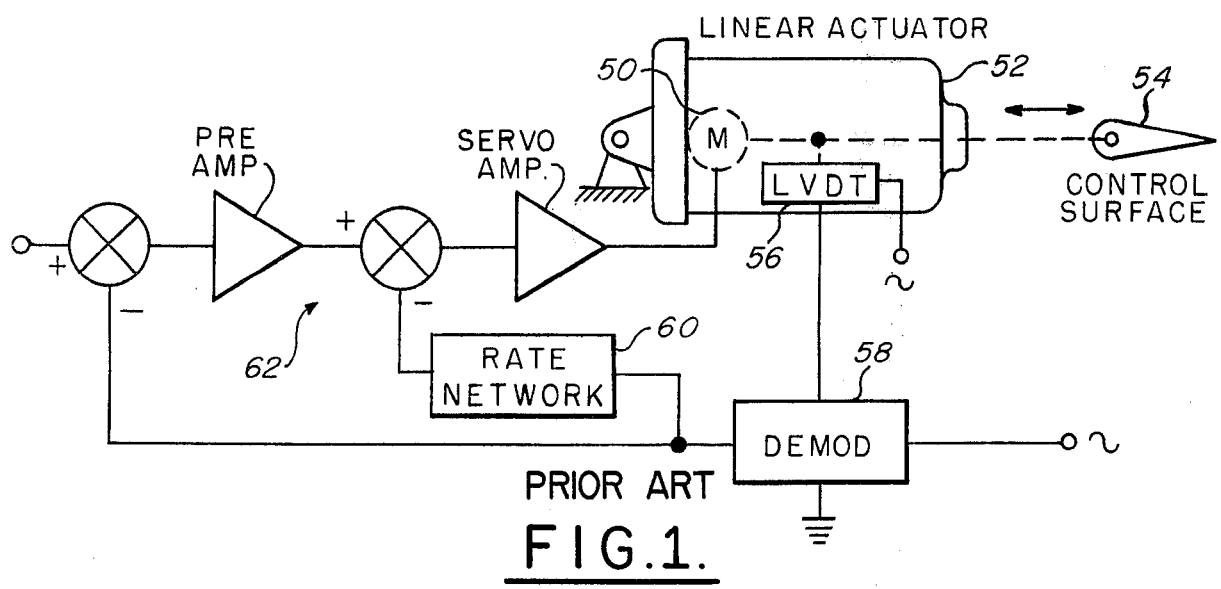
FIG. 1 is a block diagram showing a typical servosystem environment in which the invention may be used.

Because it is relatively ripple free, the present invention has application to many amplitude demodulator problems, especially where a time varying signal is to be demodulated and the resulting output is to be passed through a rate detector, or differentiator, or other high gain circuitry. Thus, it has particular applicability in autopilot control surface servosystems. Such a system is illustrated in FIG. 1 in which a servomotor 50 is connected to a conventional electric linear actuator 52 of the general type illustrated in U.S. Pat. No. 3,213,702, issued to the Applicant's assignee, which translates the rotation of the motor shaft to linear movement for controlling the position of a control surface 54, such as a rudder, elevator, or aileron. The linear actuator includes a linear voltage displacement transducer or LVDT 56 which provides a time varying a.c. position signal whose amplitude is proportional to the bidirectional linear displacement of the output shaft. This time varying signal is detected or demodulated in a demodulator 58 and the resultant demodulated signal is rate detected or differentiated in a rate detector 60 to provide a signal proportional to the velocity of the shaft's linear movement, that is, a signal proportional to the change in the shaft displacement during a unit of time. These displacement and velocity signals are then fed back into a servo amplifier 62 in the usual servo loop fashion, to control servo position and velocity, and to assure system stability.

Figure 2:
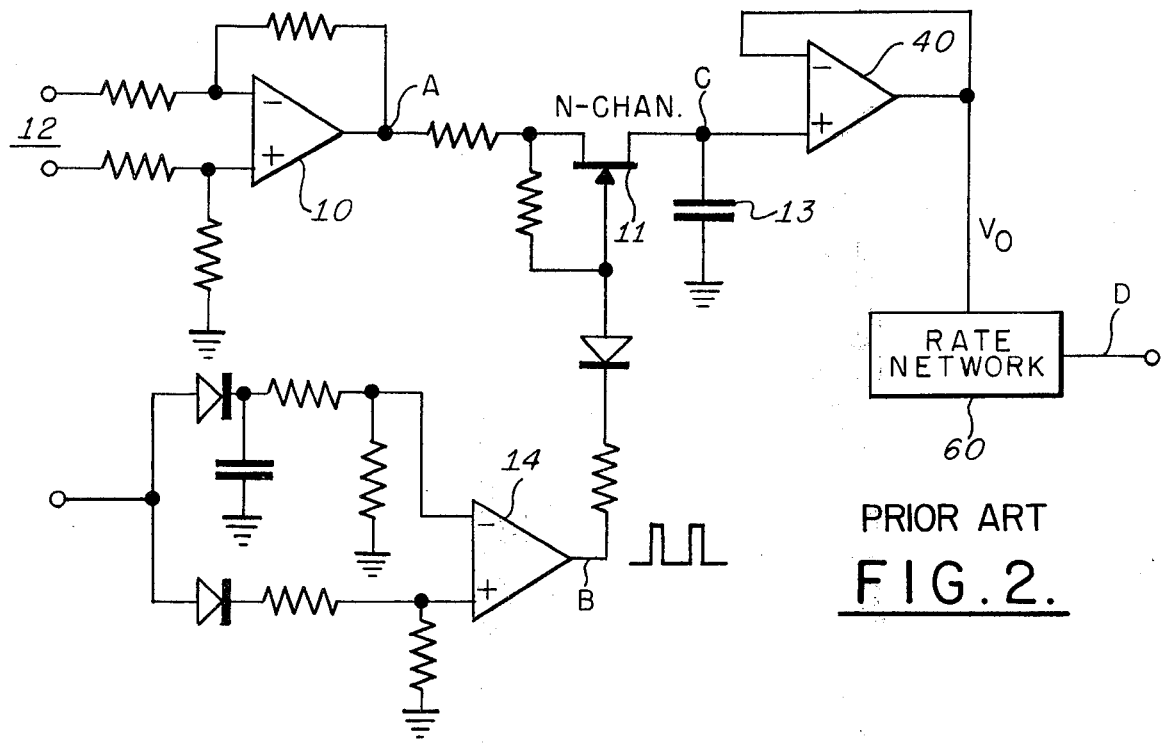
FIG. 2 is a schematic diagram of a prior art single pulse sample demodulator circuit.
Figure 3:
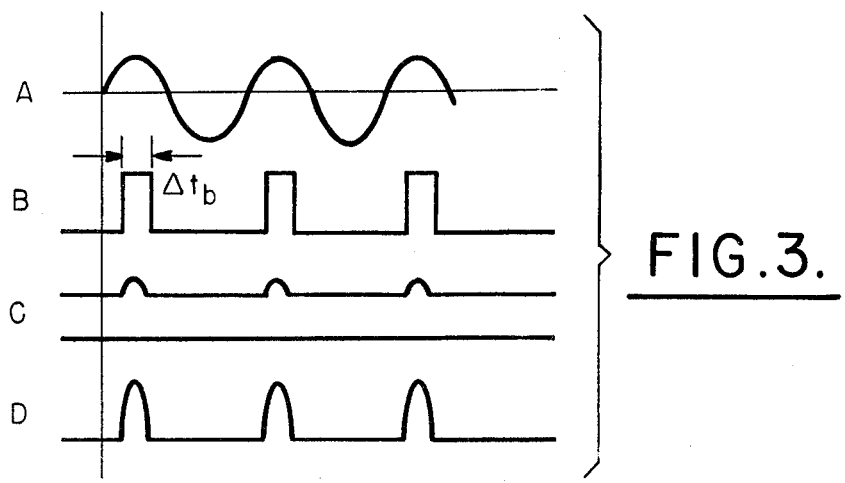
FIGS. 3A–3D show various voltage waveforms existing in the conventional demodulator circuit of FIG. 2 at nodes A, B, C and D, thereof.

To fully understand the present invention and its advantages, it is necessary to consider the prior art demodulator shown in FIG. 2 and the various voltage waveforms existing in the conventional demodulator circuit shown in FIGS. 3A through 3D. Referring to FIG. 2, the prior art pulse sample demodulator comprises a first amplifier means 10, a pulse generating circuit 14 and some type of switching device such as a field effect transistor 11. A signal to be demodulated is applied to the first amplifier 10 and the pulse generating circuit 14 producing a linearly amplified signal at node A and a short duty cycle pulse train at node B. Assuming a sinusoidally varying input signal, the waveforms at nodes A and B are shown in FIGS. 3A and 3B, respectively. The pulse train at node B causes the switching device 11 to conduct or sample the waveform at node A during the relatively short on duty cycle shown as time interval $\Delta t_b$ in FIG. 3B of the drawings. The signal sampled at node A is conducted through the device and charges a storage capacitor 13. Because an infinitely narrow pulse cannot be produced to activate the switching device 11, the voltage across the storage capacitor 13 at node C follows the waveform A for the brief time, $\Delta t_b$ that the switching device is turned on. This shows up in the form of ripples on an otherwise DC voltage as shown in FIG. 3C. This signal is run through an output buffer amplifier 40 and into the rate detector 60 of the servosystem. Referring to FIG. 3D of the drawings, it will be seen how the relatively minor ripple at node C is amplified in the rate detector because of the differentiation process. As will be demonstrated, the present demodulator of this invention blocks from the output any ripple entering the sampling circuit during the sampling interval.

Figure 4:
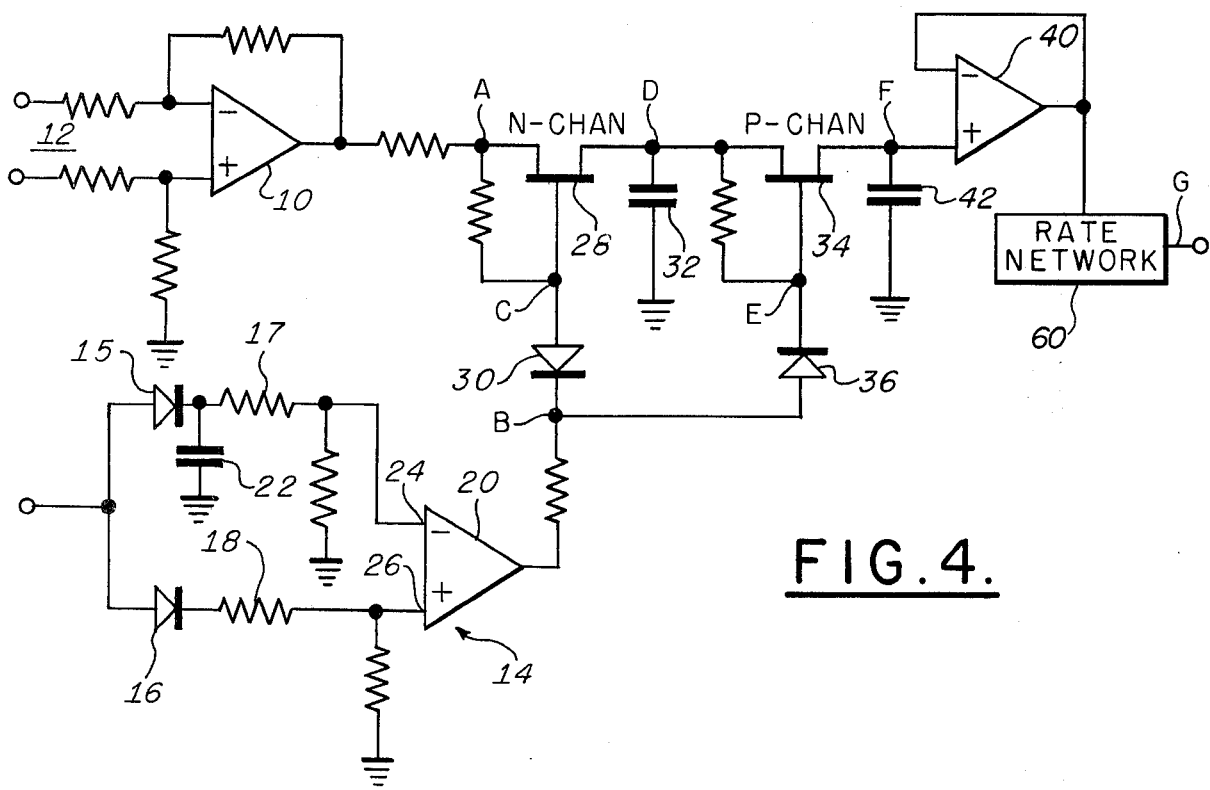
FIG. 4 is a schematic diagram of the invention.

The preferred embodiment of the present invention, as shown in FIG. 4, comprises a first amplifier 10 such as an operational amplifier configured in the usual closed loop arrangement, and having an input port 12. The invention also includes a pulse generating circuit 14 for producing a relatively short duty cycle pulse train in response to the time varying input signal. A circuit suitable for this purpose as shown in FIG. 4, comprises a pair of diodes 15 and 16 resistively coupled through resistors 17 and 18 to an operational amplifier 20. The circuit branch comprising the diode 15 and resistor 17 includes a shunt capacitor 22 between the cathode of diode 15 and ground, and that branch is connected to the inverting input 24 of the operational amplifier 20. The circuit branch comprising diode 16 and resistor 18 is connected to the non-inverting input 26 of the operational amplifier 20. The anodes of diodes 15 and 16 are connected to one another and supplied with the time varying input signal. A first field effect transistor 28 of the n-channel type is resistively connected at its source to the output of the first amplifier 10 as at node A and the gate thereof is coupled at node C through a diode 30 to the output of the operational amplifier 20. A voltage holding capacitor 32 is shunted between the drain terminal, node D, of first field effect transistor 28 and ground. A second field effect transistor 34 of the complementary, p-channel type is connected at its source to the drain of the first field effect transistor, and its gate is coupled at node E through a diode 36 to the output of the operational amplifier 20. The drain of this second field effect transistor is connected to the non-inverting input 38 of an output operational amplifier 40 which is configured in a closed loop or feedback arrangement for stability. A second voltage holding capacitor 42 is shunted between the drain terminal, node F, of the second field effect transistor 34 and ground. For optimum performance, the capacitor 42 should have less than one-tenth the capacitance of capacitor 32.

OPERATION

To demonstrate the operation of the present invention, it will be assumed that the time varying input signal is sinusoidal and is applied to the input port 12 of the first amplifier and also to the anodes of diodes 15 and 16. The input signal is amplified in a linear fashion through the first amplifier 10 such that the waveform at node A is shown in FIG. 5A as a sinusoidally time varying signal.

The time varying input signal applied to the diodes 15 and 16 cause the diodes to conduct during the positive voltage cycle only. When these diodes conduct, a positive voltage is impressed upon the inverting and non-inverting inputs of the operational amplifier 20. In addition, the shunt capacitor 22 is charged during conduction through diode 15. Because this capacitor takes a certain finite amount of time to charge up, the rising voltage applied at the inverting input 24 is delayed with respect to the rising voltage applied at the non-inverting input 26. Thus, the operational amplifier 20 is almost instantly driven into saturation by the voltage applied at the non-inverting input 26, but after the finite time required to charge the shunt capacitor 22, the same voltage reaches the inverting input 24, negating the effect of the voltage at the non-inverting input and effectively reducing the output of the operational amplifier to its quiescent or base line voltage. Thus, it will be seen that the operational amplifier 20 acts as switch to generate narrow pulse width, short duty cycle, pulse train in response to peak amplitudes of a time varying input, as shown in FIG. 5B. It will be understood that the pulse generating circuit 14 thus described is but one configuration and other functionally equivalent circuits are possible.

Figure 5:
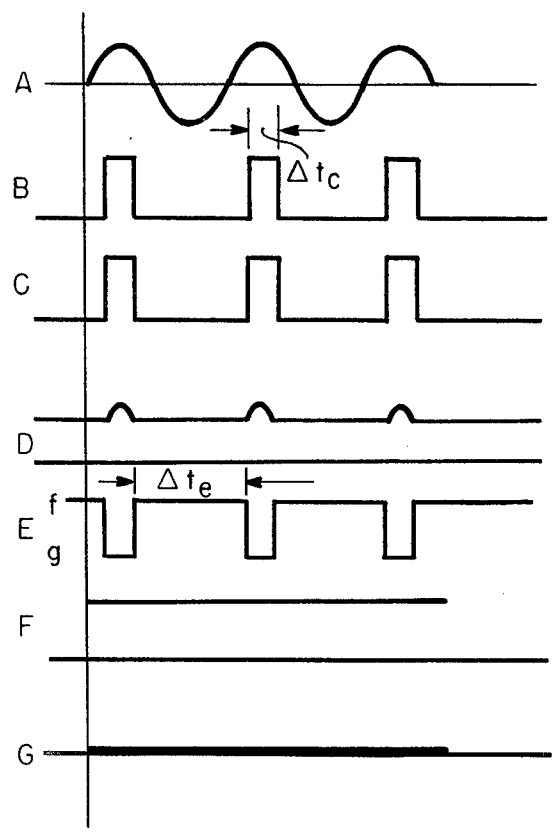
FIGS. 5A–5G show various voltage waveforms that exist at nodes A, B, C, D, E, F, and G in the circuit of this invention and in the associated servosystem, as shown in FIG. 4.

The pulse train from the pulse generator circuit 14 is directed through diodes 30 and 36 to produce waveforms at nodes C and E as shown in FIG. 5C and 5E. It will be noted that the waveform at node C is the complement of the waveform at node E, that is, the voltage at node C is high only during a first short time interval $\Delta t_c$ while the voltage at E is low; and the voltage at E is high only during the duration of the pulse train cycle, interval $\Delta t_e$. These voltages operate to consecutively turn the first and second field effect transistors 28 and 34 on and off during each cycle of the pulse train and it will be seen that the first field effect transistor 28 conducts during the relatively short interval $\Delta t_c$. Conversely, the second field effect transistor 34 conducts during the relatively long interval $\Delta t_e$. Both field effect transistors operate in a switching mode and when the first field effect transistor 28 conducts, during interval $\Delta t_c$, the voltage at node A is effectively coupled to the holding capacitor 32 at node D, which charges and tracks the peak voltage of waveform A. In the succeeding interval, $\Delta t_e$, the capacitor holds the last sampled voltage until the cycle repeats itself. The voltage at node D is shown in FIG. 5D of the drawings. The second field effect transistor 34, when switched on during interval $\Delta t_e$, effectively couples the second voltage holding capacitor 42 to the first capacitor 32. Thus, the capacitor 42 charges to the voltage held by capacitor 32 during the interval $\Delta t_e$. Because capacitor 32 is approximately ten times larger than capacitor 42, the tendency for charge to bleed from capacitor 42 to capacitor 32 is minimized. The voltage across capacitor 42 at node F is shown in FIG. 5F to be a substantially ripple free DC voltage. This voltage is coupled to the output through an output amplifier 40 acting as a buffer to prevent external loads at the output from affecting the circuit operation. When this DC voltage is rate detected through the servosystem's rate network 60, there is no ripple to differentiate and the output remains ripple free as shown in FIG. 5G.

It will be seen that the circuit thus described provides a substantially ripple free demodulation of a time varying signal which may be differentiated or highly amplified for use in sensitive servosystems without the costly and bulky filtering which can destroy system responsiveness and bandwidth. Of course, one skilled in the art will recognize that modifications are possible without departing from the spirit of the invention and the scope of the following claims. For instance, instead of generating a positive pulsed output from the pulse generating circuit 14, a negative pulse could be generated. In which case the first field effect transistor 28 might be a p-channel device and the second field effect transistor might be an n-channel device. Or the field effect transistors may be replaced by other functionally equivalent active devices.

While the invention has been described in its preferred embodiment, it is to be understood that the words which have been used are words of description rather than limitation and that changes may be made within the purview of the appended claims without departing from the true scope and spirit of the invention in its broader aspects.

What is claimed is:

1. Amplitude demodulator of the type having an input means for applying a time varying signal thereto and having an output means, said demodulator comprising:

first sampling and holding means coupled to receive said time-varying signal for sampling and holding the amplitude of said time-varying signal in a first discrete time interval, second sampling and holding means coupled to receive an output signal from said first sampling and holding means and for sampling and holding said output signal provided by said first sampling and holding means in a second discrete time interval and, pulsing means responsive to said time-varying signal for activating said first and said second sampling and holding means in said first and said second discrete time intervals whereby the amplitude of said time-varying signal is detected and coupled to said output means from said second sampling and holding means.

2. A demodulator according to claim 1 which further comprises amplifying means coupled between said input means and said first sampling and holding means.

3. A demodulator according to claim 1 wherein said demodulator further comprises amplifying means and a means for connecting said amplifying means between said second sampling and holding means and said output means.

4. A demodulator according to claim 1 wherein said first sampling and holding means comprises an active device having a first lead coupled to said input means, a second lead coupled to said pulsing means, and a third lead coupled to a capacitor.

5. A demodulator according to claim 1 wherein said second sampling and holding means comprises a capacitor means and further comprises an active device having a first lead coupled to said first sampling and holding means, having a second lead coupled to said pulsing means, and having a third lead coupled to said capacitor and to said output means.

6. A demodulator according to claim 1 wherein said first sampling and holding means comprises a first capacitor means and further comprises a first active device having a first lead coupled to said input means, a second lead coupled to said pulsing means, and a third lead coupled to said first capacitor means; and wherein said second sampling and holding means comprises a second capacitor means and further comprises a second active device having a first lead coupled to the third lead of said first active device, having a second lead coupled to said pulsing means, and having a third lead coupled to said second capacitor and to said output means.

7. A demodulator according to claim 1 wherein said pulsing means comprises a first diode and a second diode each having first and second leads associated therewith; means for supplying said time varying signal to said first lead of said first and second diodes; a capacitor coupled to said second lead of said first diode; amplifying means having inverting and non-inverting input terminals for providing inverted and non-inverted outputs in response to signals applied thereto; means for coupling one of said diodes to the inverting input of said amplifier means, and means for coupling the other of said diodes to the non-inverting input of said amplifying means.

8. A demodulator according to claim 1 wherein said pulsing means produces a relatively narrow pulse in synchronous response to the peak amplitude of said time varying signal.

9. The demodulator according to claim 1 wherein said first discrete time interval is substantially shorter than said second discrete time interval.

10. The demodulator according to claim 6 wherein said first capacitor means is substantially larger than said second capacitor means.

* * * * *